(12) United States Patent
Hollander

(10) Patent No.: US 12,050,244 B2
(45) Date of Patent: Jul. 30, 2024

(54) METHOD FOR REDUCTION OF SIC MOSFET GATE VOLTAGE GLITCHES

(71) Applicant: Teradyne, Inc., North Reading, MA (US)

(72) Inventor: Martin Hollander, Son en Breugel (NL)

(73) Assignee: Teradyne, Inc., North Reading, MA (US)

( * ) Notice: Subject to any disclaimer, the term of this patent is extended or adjusted under 35 U.S.C. 154(b) by 231 days.

(21) Appl. No.: 17/842,164

(22) Filed: Jun. 16, 2022

(65) Prior Publication Data

US 2023/0408571 A1 Dec. 21, 2023

(51) Int. Cl.
*G01R 31/26* (2020.01)
*H02M 1/088* (2006.01)
*H02M 7/537* (2006.01)

(52) U.S. Cl.
CPC ......... *G01R 31/2607* (2013.01); *H02M 1/088* (2013.01); *H02M 7/537* (2013.01)

(58) Field of Classification Search
CPC ............ G01R 31/2607; G01R 31/2608; G01R 31/2601; G01R 31/2617; G01R 31/2621;
(Continued)

(56) References Cited

U.S. PATENT DOCUMENTS

| 2004/0145407 A1* | 7/2004 | Shirasawa ............ H03K 17/162 327/434 |
| 2006/0082358 A1 | 4/2006 | Conner |

(Continued)

OTHER PUBLICATIONS

International Search Report and Written Opinion mailed Oct. 4, 2023 in connection with International Application No. PCT/US2023/025542.

(Continued)

*Primary Examiner* — Eman A Alkafawi
*Assistant Examiner* — Courtney G McDonnough
(74) *Attorney, Agent, or Firm* — Wolf, Greenfield & Sacks, P.C.

(57) ABSTRACT

Aspects of the present disclosure are directed to a circuit and methods of operating the same to provide an off-state circuit path with a programmable impedance in combination with a negative gate-to-source voltage Vgs for power transistors in an inverter configuration to prevent gate voltage glitches. Gate voltage glitch may occur due to Miller current generation across the gate path of a power transistor in the off state during rapid voltage transient dV/dt when the other, complementary power transistor is switched on or off. According to one aspect, using a negative gate-to-source voltage to turn-off a power transistor may mitigate gate voltage spikes caused by a large voltage transient when the complimentary power transistor is turned on, thus preventing parasitic turn-on of the power transistor. According to another aspect, an off-state circuit path with a programmable impedance is provided that is controllable to be in a low impedance state prior to a complementary power transistor is being turned on, such that the gate voltage glitches of the power transistor is prevented by the low impedance off-state circuit path.

22 Claims, 4 Drawing Sheets

(58) Field of Classification Search
CPC ............ G01R 31/2632; G01R 31/2834; G01R 31/2884; G01R 31/3167; G01R 31/318307; G01R 31/31905; H02M 7/537; H02M 1/088; H03K 17/102; H03K 17/04106; H03K 17/162; H03K 17/6872; H03K 19/017509; H03K 2217/0081; H03K 4/00; H03K 5/00; H03K 3/00; H03K 17/041; H03K 2217/0054
USPC ...................................................... 324/762.01
See application file for complete search history.

(56) References Cited

U.S. PATENT DOCUMENTS

| | | | |
|---|---|---|---|
| 2012/0032710 A1* | 2/2012 | Tsukada | H03K 17/0828 327/109 |
| 2013/0018613 A1 | 1/2013 | Chow | |
| 2017/0146632 A1 | 5/2017 | Wadell et al. | |
| 2020/0341060 A1 | 10/2020 | van der Wagt et al. | |
| 2020/0379043 A1 | 12/2020 | Weimer | |
| 2021/0302493 A1 | 9/2021 | Fleming et al. | |

OTHER PUBLICATIONS

[No Author Listed], Mitigation Methods for Parasitic Turn-on Effect due to Miller Capacitor. White Paper. Avago Technologies. Mar. 2010. 3 pages.

[No Author Listed], Safe Switching with IGBT Drivers. Power Supply & Power Electronics. E & E Compendium. Oct. 2014, pp. 177-179. 6 pages. URL:https://www.semikron.com/dl/services-support/downloads/download/semikron-artikel-sicher-schalten-mit-igbt-treibern-de-2014-10.pdf [last accessed Sep. 21, 2022].

Liberti et al., Mitigation technique of the SiC MOSFET gate voltage glitches with Miller clamp. AN5355 Application note. Rev 1. Jul. 2019. 19 pages. URL:https://www.st.com/resource/en/application_note/an5355-mitigation-technique-of-the-sic-mosfet-gate-voltage-glitcheswith-miller-clamp-stmicroelectronics.pdf [last accessed Sep. 21, 2022].

* cited by examiner

METHOD FOR REDUCTION OF SIC MOSFET GATE VOLTAGE GLITCHES

BACKGROUND

The present application generally relates to a test equipment for power transistors and in particular, a driving circuit for power transistors as devices under test.

Electronic components, such as semiconductor devices, circuits, and printed circuit board (PCB) assemblies, are frequently tested, during and after their manufacture, using a test system such as an automated test equipment (ATE). Testing allows for the removal of defective devices from fabrication lots, thus eliminating further unnecessary processing and packaging. In addition, test results may be used to identify malfunctioning fabrication equipment, thereby increasing device yields. Test results may also allow for binning of devices possessing varying performance and operating specifications resulting from processing variations. To perform these tests, an ATE (also referred to as a tester) may include instruments that generate input signals to and/or measure output signals from a particular device-under-test (DUT) such that a range of operating conditions can be tested on the DUT.

A DUT may include one or more power semiconductor devices. A power semiconductor device may also be referred to as a power device, power transistor, or a power switch. Examples of a power transistor include a power metal—oxide—semiconductor field-effect transistor (MOSFET) or an insulated-gate bipolar transistor (IGBT). To test a DUT having a power transistor, a tester may include a driver circuit or control circuit for controlling the power transistor.

Power transistors are sometimes used to switch on and off a current supplied to a load such as an industrial motor drive. During operation, the power transistor may be turned on in response to a gate voltage applied by the control circuit at a gate terminal of the power transistor. In the on state, the power transistor has a low-resistance between a collector terminal (or drain terminal) and an emitter terminal (or source terminal), and a current may flow through the power transistor. Whereas in the off state, the power transistor has a high resistance and little to no current can flow through the power transistor.

Power transistors are often used in pairs in an inverter configuration, in which an upper transistor and a lower transistor are connected in series between a power supply voltage and a reference voltage, with an output node in between the two power transistors. In a typical operation, the upper and lower transistors are generally turned on and off in a complimentary manner, with one of the upper/lower transistors driven to be turned on, while the other of the upper/lower transistors driven to be turned off. One known problem associated with such an operation using power transistors in an inverter topology is a gate voltage glitch phenomenon, sometimes also referred to as a parasitic turn-on phenomenon. Gate voltage glitch is caused by Miller current generation across the gate path impedance of a first power transistor in the off state during rapid change of the drain (or collector) to gate voltage transient dV/dt that may be caused by switching on of the second, complementary power transistor. The voltage drop from the Miller current may lead to a gate voltage spike at the power transistor in the off-state, which sometimes can cause the transistor to unexpectedly turn on, creating an undesirable shoot-through situation in the power transistors that could, in some situations, damage the power transistors and/or an associated device. Gate voltage glitch may also occur during negative dV/dt when the second, complimentary power transistor is switched off. For example, when the complimentary power transistor is switched off, a negative gate voltage spike in the first power transistor may occur as a result of the Miller current generation. It is desirable to avoid excessively large negative gate voltage spikes to prevent gate oxide damage to the complementary power transistor.

SUMMARY

Aspects of the present disclosure are directed to a circuit and methods of operating the same to provide an off-state circuit path with a programmable impedance in combination with a negative gate-to-source voltage Vgs for power transistors in an inverter configuration to prevent gate voltage glitches. Gate voltage glitch may occur due to Miller current generation across the gate path of a power transistor in the off state during rapid voltage transient dV/dt when the other, complementary power transistor is switched on or off. According to one aspect, using a negative gate-to-source voltage to turn-off a power transistor may mitigate gate voltage spikes caused by a large voltage transient when the complimentary power transistor is turned on, thus preventing parasitic turn-on of the power transistor. According to another aspect, an off-state circuit path with a programmable impedance is provided that is controllable to be in a low impedance state prior to a complementary power transistor is being turned on, such that the gate voltage glitches of the power transistor is prevented by the low impedance off-state circuit path.

Some embodiments are directed to an automated test equipment (ATE) for testing a device under test (DUT) is provided. The DUT comprises a first transistor having a gate terminal and a source terminal. The ATE comprises a first control circuit configured to drive the first transistor; a second control circuit configured to drive a second transistor having a gate terminal and a source terminal, the second transistor coupled to the first transistor in an inverter configuration. Each control circuit comprises: a gate line configured to be connected to the gate terminal of a corresponding transistor; a source line configured to be connected to the source terminal of a corresponding transistor; a first circuit path and a second circuit path connected in parallel between the gate line and the source line. The first circuit path is configured to switchably bias the gate line with a positive voltage relative to the source line, the second circuit path is configured to switchably bias the gate line with a negative voltage relative to the source line and comprises a programmable resistance.

Some embodiments are directed to a method for driving a first power transistor and a second power transistor coupled in an inverter configuration using a first control circuit and a second control circuit. Each control circuit comprises a first circuit path and a second circuit path connected in parallel. The method comprises driving the first power transistor with the first control circuit by: with the first circuit path, switchably coupling a gate terminal of the first power transistor with a first power source having a positive voltage relative to a source terminal of the first power transistor; with the second circuit path, switchably coupling the gate terminal of the first power transistor with a second power source having a negative voltage relative to the source terminal of the first power transistor via a first programmable resistance; and driving the second power transistor with the second control circuit by: with the first circuit path, switchably coupling a gate terminal of the second power transistor with a third power source having a positive voltage relative to a source terminal of the second power transistor; with the second circuit path, switchably coupling the gate terminal of the second power transistor with a fourth power source having a negative voltage relative to the source terminal of the second power transistor via a second programmable resistance.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

DETAILED DESCRIPTION

Figure 1:
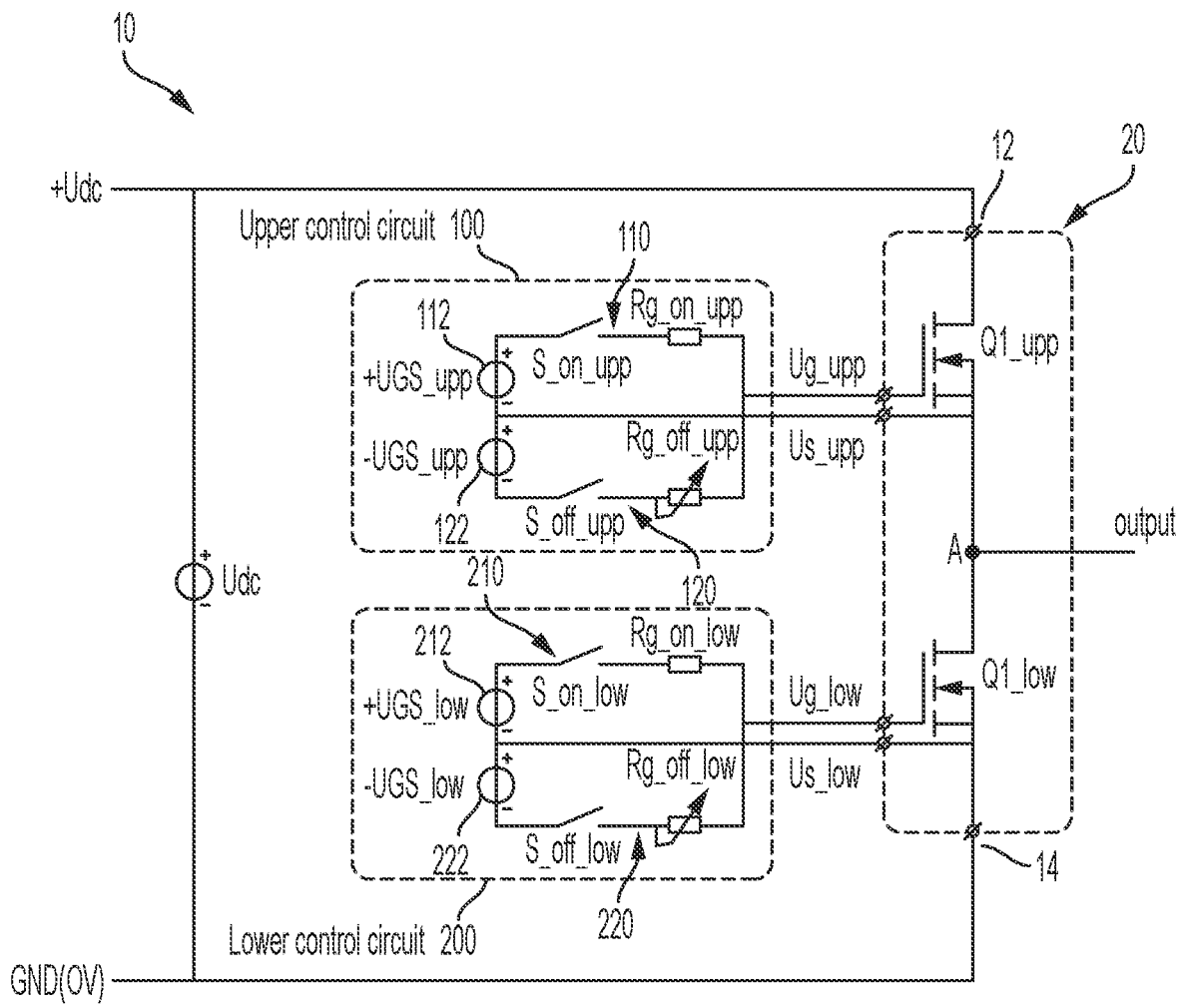
FIG. 1 is a schematic diagram illustrating a circuit for testing a DUT that includes a power transistor, in accordance with some embodiments.

Aspects of the present disclosure are directed to a circuit and methods of operating the same to provide an off-state circuit path with a programmable impedance in combination with a negative gate-to-source voltage Vgs for power transistors in an inverter configuration to prevent gate voltage glitches.

The inventor has recognized and appreciated that using a negative gate-to-source voltage to turn-off a power transistor may mitigate gate voltage spikes caused by a large voltage transient when the complimentary power transistor is turned on, thus preventing parasitic turn-on of the power transistor. In some embodiments, the power transistors are configured to switch on and off a high amount of load current such as more than 40 A, and a negative gate-to-source voltage may provide sufficient prevention of parasitic turn-on from a large disturbance in the gate voltage of the power transistor.

The inventor further recognized that even with a negative gate-to-source voltage, the finite impedance of the circuit path from the gate terminal of the off-state power transistor to the reference voltage may still lead to a large voltage drop as a result of the Miller current during voltage transient at the complimentary power transistor. To solve this problem, in some embodiments an off-state circuit path with a programmable impedance is provided. The off-state circuit path may comprise a switch controllable to bias the gate terminal of a power transistor with the negative gate-to-source voltage via the programmable resistance. The programmable resistance may be controllable to be in a low impedance state prior to a complementary power transistor is being turned on, such that the gate voltage glitches of the power transistor is prevented by the low impedance off-state circuit path. In one example, the low impedance state has a resistance of close to zero, such as less than 0.1 ohm. When the power transistor is no longer in an off-state, the programmable resistance in the off-state circuit path may be controlled to be in a high impedance state to satisfy other operational requirements of the power transistor during an on-state, or transition from an on-state to an off-state.

In some embodiments, an on-state circuit path is also provided for a power transistor. The on-state circuit path is connected in parallel to the off-state circuit path, and comprises a switch that is controllable to bias the gate terminal of the power transistor with a positive gate-to-source voltage during an on period of the power transistor.

The on-state circuit path and the off-state circuit path may be part of a control circuit for driving a power transistor. For a pair of power transistors in an inverter configuration, a circuit having two such control circuits may be provided to drive respective upper and lower transistors. Each of the two control circuits may comprise the same on-state circuit path and off-state circuit path as disclosed herein, such that each of the upper/lower transistors are prevented from gate voltage glitches during a voltage transient at the complementary switch.

Components in the two control circuits may be implemented in any suitable ways, such as integrated on a semiconductor chip, or by discreet components, or a combination thereof. In some embodiments, a controller may be provided to generate control signals for switches and programmable resistances in the control circuits based on a timing pattern to prevent gate voltage glitches in the power transistors being driven.

Some aspects are directed to an ATE for testing a DUT containing a power transistor using an inverter configuration. For example, the DUT may include a pair of power transistors, both of which may be connected to the ATE in an inverter configuration for testing. In another example, a DUT may be a single transistor device that includes only one power transistor. In such an example, a single transistor DUT may be connected in combination with an auxiliary transistor in an inverter configuration. For example, the DUT may be connected as an upper transistor, with the auxiliary transistor as the lower transistor. In some embodiments, the ATE comprises a first control circuit and a second control circuit as disclosed above to drive the upper and lower transistors, respectively, such that gate voltage glitches in both transistors may be prevented.

The aspects and embodiments described above, as well as additional aspects and embodiments, are described further below. These aspects and/or embodiments may be used individually, all together, or in any combination of two or more, as the application is not limited in this respect.

FIG. 1 is a schematic diagram illustrating a circuit 10 for testing a DUT 20 that includes a power transistor, in accordance with some embodiments.

As shown in FIG. 1, an upper power transistor Q1_upp and a lower transistor Q1_low are connected in an inverter configuration, with the source Q1_upp and Q1_low connected in series between a supply voltage +Udc and a reference voltage GND. In particular, circuit 10 has a supply terminal 12 that can be connected to a drain terminal of Q1_upp, and a ground terminal 14 that can be connected to a source terminal of Q1_low. A source terminal of Q1_upp is connected together with a drain terminal of Q1low at node A as output.

It should be appreciated that DUT 20 may include only upper transistor Q1_upp, only lower transistor Q1_low, or both Q1_upp and Q1_low, as aspects of the present disclosure are not so limited. For example, circuit 10 may be used to test a single power device DUT as the upper transistor position Q1_upp, while an auxiliary transistor may be connected as Q1_low for testing of Q1_upp. Similarly, the same circuit 10 may be used to test a single power device DUT in the Q1_low position with an auxiliary transistor connected as Q1_upp. In other examples, circuit 10 may be used to test a DUT having two or more power transistors by connecting corresponding power transistors in the DUT as Q1_upp and Q1_low, respectively.

Q1_low and Q1_high may be configured in an inverter geometry, such as a phase leg and be turned on and off successively. Q1_low and Q1_high may be MOSFETs or IGBTs, as aspects of the circuit 10 are not so limited. In one example, Q1_low and Q1_high may be a SiC MOSFET. It should be appreciated that collector/emitter terminals of an IGBT may be connected to circuit 10 in similar ways as drain/source terminals of a MOSFET. For example, a terminal of circuit 10 used to drive a drain of a MOSFET may also be used to drive a collector terminal of an IGBT instead of a MOSFET, and a terminal of circuit 10 used to drive a source of a MOSFET may also be used to drive an emitter terminal of the IGBT instead of the MOSFET.

Circuit 10 has an upper control circuit 100 for driving the upper transistor Q1_upp, and a lower control circuit 200 for driving the lower transistor Q1_low. Upper control circuit 100 has a gate line Ug_upp that can be connected to a gate terminal of Q1_upp, and a source line Us_upp that can be connected to the source terminal of Q1_upp. Lower control circuit 200 has a gate line Ug_low that can be connected to a gate terminal of Q1_low, and a source line Us_low that can be connected to the source terminal of Q1_low. As noted in the paragraph above, the term "source line" as used herein is not meant to be limiting to applications involving only MOSFETs.

Upper control circuit 100 can provide a dual-voltage power supply to control Q1_upp using an on-state circuit path 110 and an off-state circuit path 120 connected in parallel between gate line Ug_upp and source line Us_upp. The on-state circuit path 110 has a power source 112 that can bias Ug_upp with a positive Vgs voltage UGS_upp relative to Us_upp via a switch S_on_upp and an impedance Rg_on_upp. The off-state circuit path 120 has a power source 122 that can bias Ug_upp with a negative Vgs voltage –UGS_upp relative to Us_upp via a switch S_off_upp and a programmable resistance Rg_off_upp.

Still referring to FIG. 1, lower control circuit 200 is similar to upper control circuit 100, and has an on-state circuit path 210 and an off-state circuit path 220 that are connected in parallel between gate line Ug_low and source line Us_low. The on-state circuit path 210 has a power source 212 that can bias Ug_low with a positive Vgs voltage UGS_low relative to Us_low via a switch S_on_low and an impedance Rg_on_low. The off-state circuit path 220 has a power source 222 that can bias Ug_low with a negative Vgs voltage –UGS_low relative to Us_low via a switch S_off_low and a programmable resistance Rg_off_low.

Within upper control circuit 100, switches S_on_upp and S_off_upp are controlled by a pattern of control signals from a controller (not shown) to connect the gate terminal of Q1_upp to either the positive voltage source 112 or the negative voltage source 122, so as to control conduction of Q1_upp. Switches S_on_low an S_off_low in lower control circuit 200 operate in similar fashion with regards to Q1_low.

Turning to lower control circuit 200, when Q1_low is at an off state from connecting to negative power source 222 via the off-state circuit path 220, turning on Q1_upp may result in a large positive dV/dt transient across the drain/source terminals of Q1_upp that may lead to a voltage spike at the gate terminal of Q1_low due to the Miller current. Parasitic turn-on of Q1_low may be prevented due to the negative voltage –UGS_low at its gate terminal. In some embodiments, –UGS_low may be between –10 V and 0 V, between –8 V and –1 V, –5 V, or any suitable voltage value that may be selected based on the threshold voltage of Q1_low to provide protection against parasitic turn-on due to gate voltage glitches.

Still when Q1_low is at an off state, turning off Q1_upp may result in a large negative dV/dt transient across the drain/source terminals of Q1_upp that may lead to a negative voltage spike at the gate terminal of Q1_low due to the Miller current. Programmable resistance Rg_off_low may be controlled to be in a low impedance state, such that voltage drop from the Miller current from Ug_low to Us_low may be minimized, and excessive Vgs in Q1_low during turning off of Q1_upp may be prevented. In some embodiments, a low impedance state of Rg_off_low may be about zero, such as less than 0.1 ohm. When Q1_low is no longer in an off-state, Rg_off_low may be controlled to be in a high impedance state to satisfy operational requirements of Q1_low during on-state and/or a transition from an on-state to an off-state. In some embodiments, a high impedance state may be between 0.1 and 10 ohm, between 1 and 8 ohm, 5 ohm, or any suitable resistance value for operating Q1_low. For example, the high impedance state resistance may be selected such that Q1_low has a desirable dynamic behavior during switching on or off. Programmable resistance Rg_off_low may be implemented in any suitable manner now known or future-developed to provide at least two settable resistance values, and a control signal from the controller may be provided to change Rg_off_low between the low and high impedance states, or to be any other suitable resistance value.

Still focusing on lower control circuit 200, the on-state circuit path 210 has a resistance Rg_on_low that provides a resistance of between 0.1 and 10 ohm, between 1 and 8 ohm, such as 5 ohm. For example, Rg_on_low may be selected such that Q1_low has a desirable dynamic behavior during switching on or off.

In the upper control circuit 100, switches S_off_upp, S_on_upp and programmable resistance Rg_off_upp may operate in similar fashions as their counterparts in lower control circuit 200 as described above.

Figure 2:
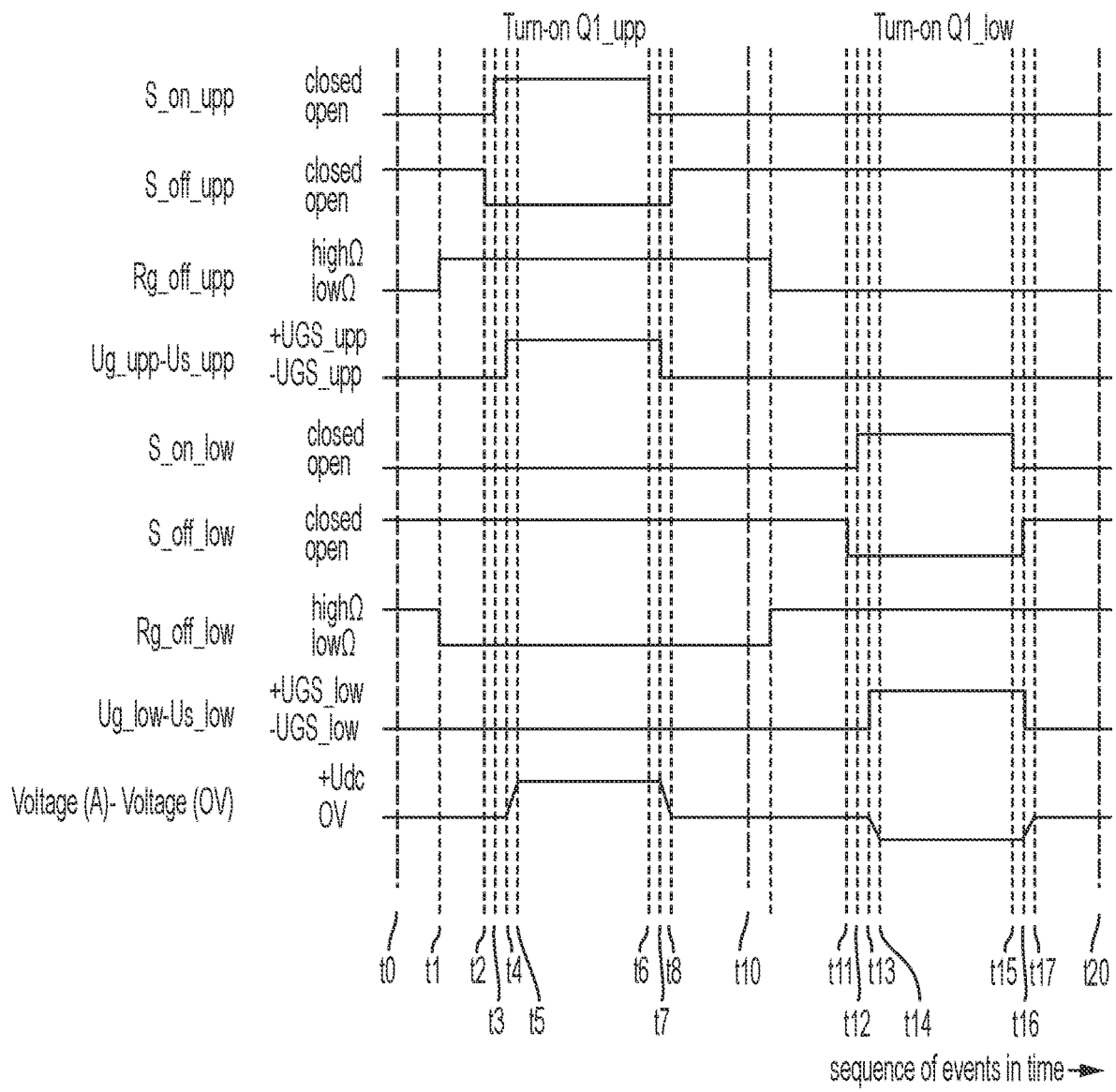
FIG. 2 is a schematic timing diagram that illustrates an exemplary timing sequence for operating the circuit as shown in FIG. 1, in accordance with some embodiments.

One aspect of the present disclosure relates to the timing of operating the switches and programmable resistances in the circuit 10. FIG. 2 is a schematic timing diagram that illustrates an exemplary timing sequence for operating circuit 10 as shown in FIG. 1, in accordance with some embodiments.

In FIG. 2, the upper transistor Q1_upp is turned on and then off during the time period between t0 and t10, and the lower transistor Q1_low is turned on and then off during the time period between t10 and t20.

At time t1, Rg_off_upp and Rg_off_low are set in specific state. As shown, Rg_off_upp is set to a high impedance state, while Rg_off_low is set to a low impedance state. It should be appreciated that the exact timing of t1 is not important, nor is it a requirement that Rg_off_upp and Rg_off_low be set at the same moment, as long as both their states are prior to time t2.

At time t2, S_off_upp is opened, and after a certain wait time S_on_upp is closed at t3, resulting in the upper gate-source voltage increasing and approaching +UGS_upp at time t4. As a result, Q1_upp is turned-on into a conductive state.

Around time t4, the voltage (A) at output node A starts to increase until it reaches +Udc at time t5. This positive voltage transient dV/dt between time t4 and t5 causes a Miller current to flow and influence the gate-source voltage of Q1_low. The Miller current is caused by a Miller capacitance at the gate of Q1_low and the voltage transient at node A at turn-on of Q1_upp. The Miller current is directed to the lower control circuit 200 through Rg_off_low, which prior to time t2 has already been set to a low impedance state with a very low voltage drop. As a result, the gate voltage glitch phenomenon in Q1_low during turning on of Q1_upp is prevented.

At time t6, S_on_upp is opened, causing the gate-source voltage on Q1_upp to decrease at time t7 and Q1_upp to transition from conductive to a non-conductive or blocking state at t8. As shown in the last trace in FIG. 3, during this transition and around time t7, the voltage (A) at output node A starts to decrease until it reaches 0 V at time t8. This negative voltage transient dV/dt causes a Miller current at the gate of Q1_off to flow in an opposite direction compared to the time period between t4 and t5 when Q1_upp is turned on. Since Rg_off_low has low resistance at this moment in time, the gate voltage glitch phenomenon in Q1_low is prevented.

From time t10 to t20, circuit 10 is operated in a similar manner, but with Q1_low being turned on into a conduction state, and the gate voltage glitch phenomenon in Q1_upp being mitigated from the resulting Miller current to at the gate of Q1_upp.

It should be appreciated that the timing sequence illustrated in FIG. 2 is but one example of how the circuit 10 may be operated to test a DUT containing a power transistor, and aspects of the present disclosure are not so limited. As one variation, while FIG. 2 shows that the lower transistor Q1_low is turned on during time periods t10 to t20, the sequence from t10 to t20 is optional as it is not a requirement that Q1_low be turned on when only Q1_upp is being tested. In some embodiments, Q1_low may be a passive auxiliary transistor used for testing a power transistor connected as Q1_upp. In such embodiments, the gate terminal to Q1_off may be connected to a constant negative gate voltage –UGS_low, while the upper transistor is actively switched on and off using the first control circuit 100. As another variation, in some embodiments a test sequence may alternatively be used to test a power transistor connected as Q1_low only, and not Q1_upp. In such embodiments a passive auxiliary transistor may be connected as Q1_upp.

Figure 3:
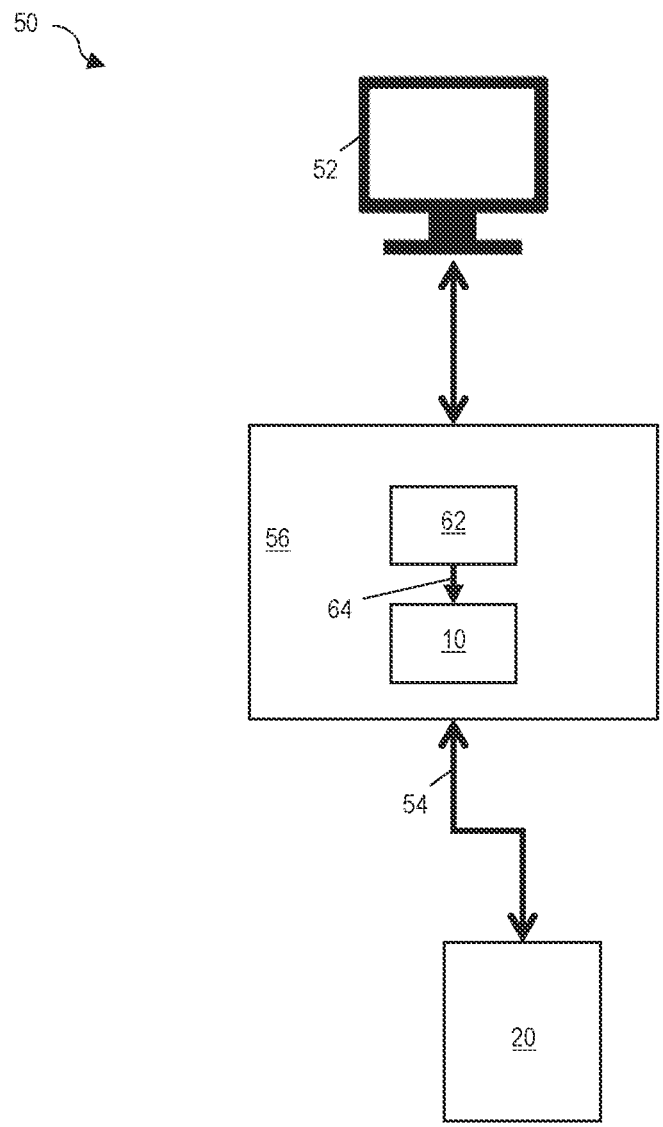
FIG. 3 is a schematic diagram of an exemplary embodiment of an automated test system in which a circuit according to aspects of the present application may be applied.

FIG. 3 is a schematic diagram of an exemplary embodiment of an automated test system in which a circuit according to aspects of the present application may be applied. FIG. 3 illustrates a test system 50 that contains a test computer 52 that controls a tester 56 to perform tests on a device under test (DUT) 20 in accordance to methods disclosed in the present application. In some scenarios, the tester 56 may be an automated test equipment (ATE), constructed using techniques that are known in the art. The DUT 20 may be any suitable device for testing. DUT 20 may be a semiconductor device and in some embodiments may include one or more power transistors.

In FIG. 3, ATE 56 may contain circuitry to generate and/or measure multiple test signals 54 for DUT 20. For example, ATE 56 may include circuit 10 configured to generate drive one or more power transistors in DUT 20. ATE 56 may additionally include a controller 62 having one or more timing generators and/or pulse generators configured to synchronize the generation of the multiple control signals 64 to control timings of switches and programmable resistances in the circuit 10. In some embodiments, controller may comprise a software controlled pulse generator, although any suitable pulse generator may be used.

It should be appreciated that FIG. 3 is a greatly simplified representation of an automated test system. For example, though not illustrated, test system 50 may include control circuitry that controls operation of instruments within ATE 56. Additionally, test system 50 may include processing circuitry to process measurements and determine whether a DUT 20 is operating correctly. Further, though FIG. 3 illustrates a scenario in which a single DUT 20 is being tested, test system 50 may be configured to test multiple devices. Regardless of the number of instruments or other components generating or measuring test signals and the number of devices under test, test system 10 may include signal delivery components that route the signals between the DUT 20 and the instruments within ATE 56.

Further, it should be appreciated that other components as illustrated are exemplary rather than limiting. For example, although the test computer 52 is illustrated as a personal computer (PC) in FIG. 3, it should be appreciated that any suitable computing device may be used to implement a test computer, for example, a mobile device or a computer work station. Test computer 52 may be connected to a network and capable of accessing resources over the network and/or communicate with one or more other computers connected to the network.

Figure 4:
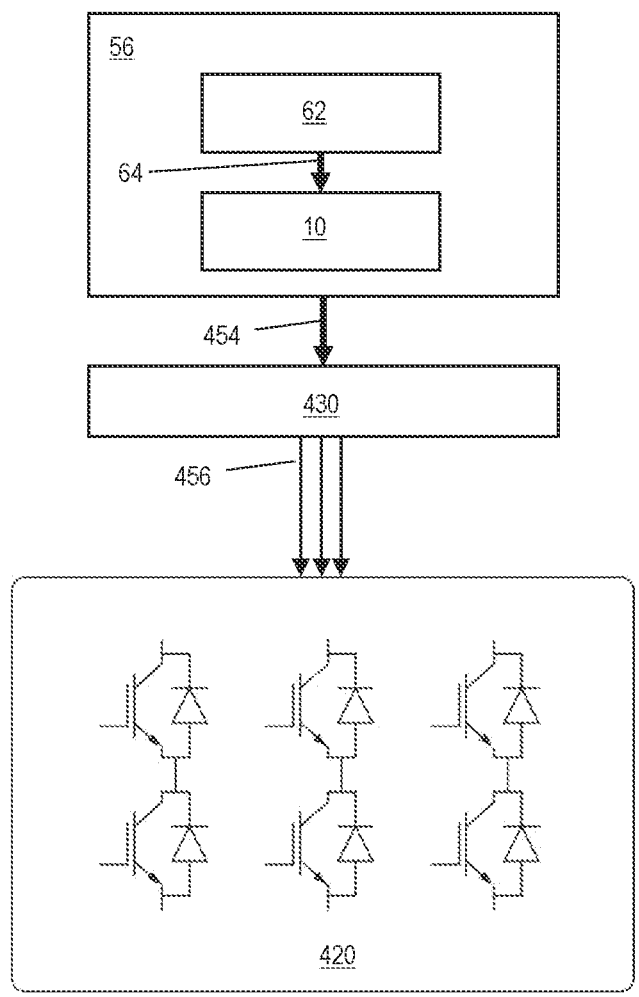
FIG. 4 is a schematic diagram of a variation of the automated test system in FIG. 3 using a device-interface board, in accordance with some embodiments.

FIG. 4 is a schematic diagram of a variation of the automated test system in FIG. 3 using a device-interface board, in accordance with some embodiments. As shown in FIG. 4, ATE 56 is connected to a device-interface board (DIB) 430, and the DIB 430 is connected to a DUT 420 having a plurality of power transistors to route signals 454 from ATE 56 as test signals 456 to selected power transistors on the DUT 420. DIB 430 includes multiple contact points for connecting to respective gate and source terminals of the power transistors in the DUT 420, and routing circuitry for connecting to the gate lines and source lines in the circuit 10 of ATE 56. The routing circuitry in DIB 430 is configured to interconnect the gate lines and source lines of control circuits in the circuit 10 to respective contact points such that the gate lines in the control circuits are connected to respective gate terminals of the transistors in the DUT, and the source lines in the control circuits are connected to respective source terminals of the transistors in the DUT. The routing circuitry may be implemented in any suitable ways, and may comprise a multiplexer.

Having thus described several aspects of at least one embodiment of this invention, it is to be appreciated that various alterations, modifications, and improvements will readily occur to those skilled in the art.

Such alterations, modifications, and improvements are intended to be part of this disclosure, and are intended to be within the spirit and scope of the invention. Further, though advantages of the present invention are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. An automated test equipment (ATE) for testing a device under test (DUT) comprising a first transistor having a gate terminal and a source terminal, the ATE comprises:
   a first control circuit configured to drive the first transistor;
   a second control circuit configured to drive a second transistor having a gate terminal and a source terminal, the second transistor coupled to the first transistor in an inverter configuration, each control circuit comprises:
   a gate line configured to be connected to the gate terminal of a corresponding transistor;
   a source line configured to be connected to the source terminal of a corresponding transistor;
   a first circuit path and a second circuit path connected in parallel between the gate line and the source line, wherein
   the first circuit path is configured to switchably bias the gate line with a positive voltage relative to the source line,
   the second circuit path is configured to switchably bias the gate line with a negative voltage relative to the source line and comprises a programmable resistance.

2. The ATE of claim 1, wherein the DUT comprises the second transistor.

3. The ATE of claim 1, wherein in each of the first and second control circuits:
   the first circuit path comprises a first power source coupled to the source line via a first switch, and
   the second circuit path comprises a second power source coupled to the source line via a second switch.

4. The ATE of claim 3, wherein
   the second switch in the second circuit path of the first control circuit is configured to switch from a closed state to an opened state at a first instant of time, and
   the programmable resistance in the second circuit path of the second control circuit is configured to change from a high impedance state to a low impedance state prior to the first instant of time.

5. The ATE of claim 4, wherein
   the first switch in the first circuit path of the first control circuit is configured to be closed at a second instant of time subsequent to the first instant of time to bias the gate line in the first control circuit.

6. The ATE of claim 4, wherein
   the second switch in the second circuit path of the second control circuit is configured to be closed prior to the first instant of time.

7. The ATE of claim 4, wherein
   the programmable resistance in the second circuit path of the first control circuit is configured to change from a low impedance state to a high impedance state prior to the first instant of time.

8. The ATE of claim 5, wherein
   the first switch in the first circuit path of the first control circuit is configured to be opened at a third instant of time subsequent to the second instant of time, and
   the second switch in the second circuit path of the first control circuit is configured to switch from an opened state to a closed state at a fourth instant of time subsequent to the third instant of time.

9. The ATE of claim 8, wherein
   the programmable resistance in the second circuit path of the second control circuit is configured to change from the low impedance state to the high impedance state subsequent to the fourth instant of time, and
   the programmable resistance in the second circuit path of the first control circuit is configured to change from a high impedance state to a low impedance state subsequent to the fourth instant of time.

10. The ATE of claim 1, wherein
    the first transistor in the DUT is an insulated-gate bipolar transistor (IGBT) and the source terminal of the first transistor is an emitter terminal of the IGBT.

11. The ATE of claim 1, wherein
    the first transistor in the DUT is a metal-oxide-semiconductor field-effect transistor (MOSFET).

12. The ATE of claim 1, wherein
    the programmable resistance has a resistance that is programmable from about zero to about 10 ohm.

13. The ATE of claim 12, wherein
    the programmable resistance has a high impedance state having a resistance of between 1 and 10 ohm, and a low impedance state having a resistance of less than 0.1 ohm.

14. The ATE of claim 1, further comprising a controller operable to control timings of switches and the programmable resistance in the first circuit path and the second circuit path of the first and second control circuits.

15. The ATE of claim 1, wherein the DUT comprises a plurality of transistors, and the ATE further comprises:
    a device-interface board (DIB), the DIB comprising:
    a plurality of contacts configured to be coupled to the gate and source terminals of the transistors in the DUT, and
    routing circuitry coupled to the gate lines and source lines in the first and second control circuits, and configured to interconnect the gate lines and source lines to respective contacts such that the gate lines in the first and second control circuits are connected to respective gate terminals of the transistors in the DUT, and the source lines in the first and second control circuits are connected to respective source terminals of the transistors in the DUT.

16. A method for driving a first power transistor and a second power transistor coupled in an inverter configuration using a first control circuit and a second control circuit, each control circuit comprising a first circuit path and a second circuit path connected in parallel, the method comprising:
driving the first power transistor with the first control circuit by:
with the first circuit path, switchably coupling a gate terminal of the first power transistor with a first power source having a positive voltage relative to a source terminal of the first power transistor;
with the second circuit path, switchably coupling the gate terminal of the first power transistor with a second power source having a negative voltage relative to the source terminal of the first power transistor via a first programmable resistance; and driving the second power transistor with the second control circuit by:
with the first circuit path, switchably coupling a gate terminal of the second power transistor with a third power source having a positive voltage relative to a source terminal of the second power transistor;
with the second circuit path, switchably coupling the gate terminal of the second power transistor with a fourth power source having a negative voltage relative to the source terminal of the second power transistor via a second programmable resistance.

17. The method of claim 16, wherein
driving the first power transistor comprises switchably coupling the gate terminal of the first power transistor with the second power source at a first instant of time, and
driving the second power transistor comprises changing the second programmable resistance from a high impedance state to a low impedance state prior to the first instant of time.

18. The method of claim 17, wherein driving the first power transistor further comprises:
closing a first switch in the first circuit path of the first control circuit at a second instant of time subsequent to the first instant of time to bias the gate terminal of the first power transistor.

19. The method of claim 18, wherein driving the second power transistor further comprises:
closing a second switch in the second circuit path of the second control circuit prior to the first instant of time.

20. The method of claim 17, wherein driving the first power transistor further comprises:
changing the first programmable resistance in the second circuit path of the first control circuit from a low impedance state to a high impedance state prior to the first instant of time.

21. The method of claim 18, wherein driving the first power transistor further comprises:
opening the first switch in the first circuit path of the first control circuit at a third instant of time subsequent to the second instant of time, and
closing a second switch in the second circuit path of the first control circuit at a fourth instant of time subsequent to the third instant of time to disconnect the second power source from the source terminal of the first power transistor.

22. The method of claim 21, wherein driving the second power transistor further comprises:
changing the second programmable resistance in the second circuit path of the second control circuit from the low impedance state to the high impedance state subsequent to the fourth instant of time, and
driving the first power transistor further comprises:
changing the first programmable resistance in the second circuit path of the first control circuit from a high impedance state to a low impedance state subsequent to the fourth instant of time.

* * * * *